United States Patent [19]

Johnson et al.

[11] Patent Number: 4,663,237

[45] Date of Patent: May 5, 1987

[54] METHOD FOR EMBEDDING ELECTRICAL AND ELECTRONIC CIRCUITRY

[75] Inventors: Constance A. Johnson, Hamden; Aspet V. Merijanian, Middlebury, both of Conn.

[73] Assignee: Uniroyal Chemical Company, Inc., Middlebury, Conn.

[21] Appl. No.: 851,031

[22] Filed: Apr. 11, 1986

Related U.S. Application Data

[62] Division of Ser. No. 655,479, Sep. 27, 1984, Pat. No. 4,587,140.

[51] Int. Cl.$^4$ .............................................. B32B 27/00
[52] U.S. Cl. .................................. 428/500; 525/331.7; 525/333.8; 525/386; 525/387
[58] Field of Search ................. 428/500; 525/331.7, 525/333.8, 386, 387

[56] References Cited

U.S. PATENT DOCUMENTS

| | | | |
|---|---|---|---|
| 3,819,592 | 6/1974 | Visser et al. | 260/80.78 |
| 3,974,132 | 8/1976 | Valdiserri | 526/20 |
| 4,025,706 | 5/1977 | Schober | 526/57 |
| 4,220,579 | 9/1980 | Rinehart | 260/33.6 |
| 4,247,661 | 1/1981 | Herman et al. | 525/88 |

*Primary Examiner*—Edith Buffalow
*Attorney, Agent, or Firm*—William E. Dickheiser

[57] ABSTRACT

A method of protecting electrical or electronic circuitry by embedding said circuitry in a low molecular weight ethylene-alpha-olefin copolymer composition.

4 Claims, No Drawings

METHOD FOR EMBEDDING ELECTRICAL AND ELECTRONIC CIRCUITRY

This is a division of application Ser. No. 655,479, filed Sept. 27, 1984, now U.S. Pat. No. 4,587,140.

FIELD OF THE INVENTION

This invention relates to a method for providing a protective encasement for electrical and electronic circuitry.

BACKGROUND OF THE INVENTION

Electrical and electronic circuitry (hereinafter also identified as circuitry) is often utilized under situations such that it is subject to adverse environmental conditions and physical stress including shock and mechanical abuse as well as severe point pressure and abrasion. To eliminate or at least lessen any detrimental effect on the circuitry, the electric or electronic items are usually embedded in a protective encasement. The process of embedding is thus understood to mean generically the protection of electrical or electronic circuits or components from detrimental influences such as pressure, abrasion, moisture, oxyen, etc. Such embedding may be accomplished by casting, potting, impregnating, encapsulating, transfer molding and the like. The materials used for this purpose must have high electrical resistivity or resistance, and ought to exhibit high arc resistance and track resistance.

Polymers are commonly employed embedding materials. The preferred polymers of the prior art include polyester resins, epoxy resins, silicone rubbers, polysulfide elastomers, polyurethane elastomers, butyl rubber, moderate and high molecular weight EPDM rubber and the like.

There is a constant search for improved embedding materials that not only are pourable under application conditions but have enhanced ability to conform to intricate and, at times, minute structures. In addition, improved (low temperature) flexibility, i.e., resistance to cracking, as well as clarity, relatively low density and thermal stability are continually being pursued.

SUMMARY OF THE INVENTION

A method of protecting electrical and electronic circuitry has been discovered wherein said circuitry is embeddd in a low molecular weight ethylene-alpha-olefin copolymer composition.

DETAILED DESCRIPTION OF THE INVENTION

The instant invention relates to the discovery of a method for embedding electrical or electronic circuitry wherein a composition comprising an ethylene-alpha-olefin copolymer having a molecular weight of from about 1,000 to about 10,000 and a curative for said copolymer, is applied to said circuitry and cured.

By the term, "ethylene-alpha-olefin copolymers" is understood copolymers of ethylene with at least one monomer having the formula $CH_2CHR$ wherein R is $C_1$–$C_{10}$ preferably $C_1$–$C_4$ linear or branched alkyl, most preferably methyl. Preferably, such copolymers contain one or more non-conjugated diene such as dicyclopentadiene (DCPD), 5-ethylidene-2-norbornene, or 1,4-hexadiene. The ethylene/alpha-olefin weight ratio may range from 85/15 to 35/65, preferably 75/25 to 45/55 and most preferably 70/30 to 50/50. The amount of non-conjugated diene present in such copolymer may vary between about 0 and 35 percent, preferably 3 and 35 percent and most preferably between 5 and 20 percent, all by weight. Such ethylene-alpha-olefin copolymers are known to the art, and their preparation is disclosed in U.S. Pat. Nos. 3,819,592 (Visser et al) and 3,896,094 (Visser), which patents are herewith incorporated by reference.

The molecular weight of the copolymers ranges from about 500 to 20,000 preferably from about 1,000 to 10,000, usually from about 3,000 to 7,000.

In order to crosslink ethylene-alpha-olefin copolymers, organic (hydro) peroxides are effectively employed, and when such copolymers contain non-conjugated dienes, crosslinking may be achieved by so-called sulfur curatives.

For example, as peroxides may be used 1,1-bis(di-t-butylperoxy)-3,3,5-trimethylcyclohexane; 0,0-di-t-butyl-0-(2-ethylhexyl)monoperoxy carbonate; ethyl-3,3-bis(t-butyl-peroxy) butyrate; dicumyl peroxide; benzoyl peroxide; 1,4-bis(t-butylperoxyisopropyl) benzene; 4,4,4', 4'-tetra(t-butylperoxy)-2,2-dicyclohexylpropane and the like. As sulfur curatives may be mentioned, sulfur, sulfur donor compounds, accelerators, etc. such as dimethylthiuram disulfide, diphenylthiuram disulfide, dipentamethylenethiuram hexasulfide, tetramethylthiuram disulfide, zinc diethyldithiocarbamate, 4,4'-dithiodimorpholine, N,N'-dithiobis(hexahydro-2H-azepinion-2), dialkyldithiocarbamates, mercaptobenzothiazole, 4-morpholinylbenzothiazyl disulfide and others. Curatives are preferably present in the range of from about 2–20 parts per hundred parts of copolymer (phr).

Curing coagents may be incorporated in such embedding compositions for the purpose of enhancing crosslinking. Among the coagents may be mentioned 1,6-hexanediol diacrylate, lauryl methacrylate, trimethylolpropane triacrylate, ethylene dimethacrylate, 1,3-butylene dimethacrylate and the like. Curing coagents are preferably present at about 0.5–20 phr.

If so desired, the compositions of this invention may be diluted by the addition of minor amounts of aliphatic or aromatic solvents such as hexane, heptane, decane, dodecane, toluene, xylene or the like or of solvents co-reactive upon curing such as styrene, vinyl toluene, alphamethylstyrene, divinylbenzene etc.

Optionally, the embedding composition may include reinforcing or non-reinforcing fillers such as fumed or precipitated silica, aluminum trihydrate, aluminum silicates and others, preferably in the range of from about 10 to about 150 phr, provided such fillers do not detrimentally affect the electrical properties of the composition.

When cured, the embedding compositions result in solid, elastomeric materials having a tensile strength of at least 30 psi (207 kPa), usually of at least 70 psi (483 kPa) and elongation of at least 30%, generally 50% or more, preferably 70% or higher. The Shore A hardness of such cured embedding compositions may be 10 or more, usually 20 or higher. Volume resistivity of the embedding compositions should be at least $10^9$ ohms-cm, preferably $10^{11}$ or higher, most preferably $10^{14}$–$10^{16}$ ohms-cm with a dielectric strength (volts/mil) of at least 200, preferably 250 or more, most preferably 400–600. The electrical dissapation factor should not be more than 0.1, preferably less than 0.05 and most preferably be in the range of 0.0001–0.01 with an arc resistance of 50–150, preferably 100–150 and most preferably 120–150, while having a dielectric constant (at 1 khz) of not more than 8, preferably 2-5, most preferably 2-3.

C.). Physical and electrical properties were then determined as indicated in Table I below.

TABLE I

|  | Run No. | | | | | | | | |
|---|---|---|---|---|---|---|---|---|---|
|  | 1 | 2 | 3 | 4 | 5 | 6 | 7 | 8 | 9 |
| EPDM-1, g | 50 | 50 | 50 | 50 | 50 | — | — | — | — |
| EPDM-2, g | — | — | — | — | — | 50 | 50 | 50 | 50 |
| PIDA, g | 0.1 | 0.1 | 0.1 | 0.1 | 0.1 | 0.1 | 0.1 | 0.1 | 0.1 |
| Peroxide-1, g | 3.0 | 3.0 | 1.5 | 1.5 | 1.5 | 3.0 | 3.0 | 1.5 | 1.5 |
| Co—Agent-1, g | — | — | — | 5.0 | 5.0 | — | — | 5.0 | 5.0 |
| Filler, g | — | 10 | 10 | — | 10 | — | 10 | — | 10 |
| Properties | | | | | | | | | |
| Tensile Strength, | | | | | | | | | |
| psi | 106 | 366 | 363 | 230 | 530 | 92 | 360 | 215 | 179 |
| kPa | 731 | 2534 | 2503 | 1586 | 3654 | 634 | 2482 | 1482 | 1234 |
| Elongation, % | 23 | 63 | 380 | 150 | 107 | 37 | 63 | 160 | 77 |
| Hardness, Shore A | 52 | 68 | 38 | 40 | 62 | 42 | 68 | 31 | 45 |

All compounds had a volume resistivity of $10^{13}$ ohm-cm or higher.
Remarks
EPDM-1: Ethylene/propylene (E/P) = 48/52; DCPD = 9% (wt); $\overline{M}_v$ = 6550; [n] = 0.33 at 135° C. in tetralin.
EPDM-2: E/P = 48/52; DCPD = 10% (wt); $\overline{M}_v$ = 3400, [n] = 0.21
PIDA: 4,4-bis(phenylisopropyl) diphenylamine, antioxidant
Peroxide-1: 1,4-bis(t-butylperoxyisopropyl) benzene (96%)
Co—Agent-1: 1,6-Hexanediol diacrylate
Filler: Hydrated silica Compositions of this invention may be readily prepared by compounding the ethylene-alpha-olefin copolymer with the curative and any optional ingredient including antioxidants, u.v. stabilizers and the like in a suitable blender such as a two-roll open mill, internal (e.g. Banbury (trademark), mixer, transfer mixer, homogenizer and the like.

EXAMPLE 1

Several blends were prepared for evaluation of their cured physical and electrical properties by blending the ingredients listed below in a 100 ml beaker using a spatula. After mixing, the compositions were poured into a 6"×6"×0.12" (15.24 cm×15.24 cm×0.3 cm) mold, and then placed into a press for 20 minutes at 220° F. (104.4° C.) and thereafter for 10 minutes at 360° F. (182°

The data clearly demonstrates the wide range of physical properties attainable with the compositions of this invention while maintaining high volume resistivity.

EXAMPLE 2

Various curatives were evaluated for making cured embedding compositions using essentially the method outline above; the results are tabulated below.

TABLE II

|  | Run No. | | | | | | | |
|---|---|---|---|---|---|---|---|---|
|  | 10 | 11 | 12 | 13 | 14 | 15 | 16 | 17 |
| EPDM-1 | 50 | 50 | 50 | 50 | 50 | 50 | — | — |
| EPDM-3 | — | — | — | — | — | — | 50 | 50 |
| PIDA | 0.1 | 0.1 | 0.1 | 0.1 | 0.1 | 0.1 | 0.1 | 0.1 |
| Peroxide-1 | 0.5 | 1.5 | 2.5 | — | — | — | — | — |
| Peroxide-2 | — | — | — | 1.5 | — | — | — | — |
| Peroxide-3 | — | — | — | — | 1.5 | — | — | — |
| Peroxide-4 | — | — | — | — | — | 1.5 | — | — |
| Peroxide-5 | — | — | — | — | — | — | 1.5 | — |
| Peroxide-6 | — | — | — | — | — | — | — | 1.5 |
| Properties | | | | | | | | |
| Tensile Strength, | | | | | | | | |
| psi | 119 | 230 | 204 | 298 | 214 | 215 | 147 | |
| kPa | 820 | 1586 | 1407 | 2055 | 1476 | 1482 | 1014 | |
| Elongation, % | 395 | 150 | 83 | 250 | 323 | 260 | 353 | |
| Hardness, Shore A | 17 | 40 | 52 | 25 | 5* | 7* | 0* | |

The volume resistivity of all experimental samples was at least $10^{13}$ ohm-cm.
Remarks
Peroxide-1: See Example 1
Peroxide-2: Tert. butylperoxy benzoate
Peroxide-3: Dicumyl peroxide
Peroxide-4: 1,1-bis(t-butylperoxy)-3,3,5-trimethylcyclohexane
Peroxide-5: 0,0-t-butyl-0-(2-ethylhexylmonoperoxycarbonate)
Peroxide-6: Ethyl-3,3-bis(t-butylperoxy) butyrate
EPDM-3: E/P = 49/51; DCPD = 9% (wt); $\overline{M}_v$ = 6500
*Samples somewhat tacky.

As is evident, a wide variety of peroxides may be utilized for carrying out the invention.

EXAMPLE 3

Following essentially the procedure disclosed in Example-1, various co-agents were evaluated for the preparation of embedding compositions. The recipes and results are summarized in Table III.

TABLE III

| | Run No. | | | | | | | | | | |
|---|---|---|---|---|---|---|---|---|---|---|---|
| | 18 | 19 | 20 | 21 | 22 | 23 | 24 | 25 | 26 | 27 | 28 |
| EPDM-1, g | 50 | 50 | 50 | 50 | 50 | 50 | 50 | — | — | — | — |
| EPDM-3, g | — | — | — | — | — | — | — | 50 | 50 | 50 | 50 |
| Peroxide-1, g | 1.5 | 1.5 | 1.5 | 1.5 | 1.5 | 1.5 | 1.5 | 1.5 | 1.5 | 1.5 | 1. |
| Co—Agent-1, g | 2.5 | 5.0 | 10.0 | 20.0 | — | — | — | — | — | — | — |
| Co—Agent-2, g | — | — | — | — | 5.0 | — | — | — | — | — | — |
| Co—Agent-3, g | — | — | — | — | — | 5.0 | — | — | — | — | — |
| Co—Agent-4, g | — | — | — | — | — | — | 5.0 | — | — | — | — |
| Co—Agent-5, g | — | — | — | — | — | — | — | 5.0 | — | — | — |
| Co—Agent-6, g | — | — | — | — | — | — | — | — | 5.0 | — | — |
| Co—Agent-7, g | — | — | — | — | — | — | — | — | — | 5.0 | — |
| Co—Agent-8, g | — | — | — | — | — | — | — | — | — | — | 5.0 |
| Properties | | | | | | | | | | | |
| Tensile Strength, | | | | | | | | | | | |
| psi | 141 | 230 | 399 | 249 | 263 | 173 | 133 | 142 | 102 | 95 | 166 |
| kPa | 972 | 1586 | 2751 | 1717 | 1813 | 1193 | 917 | 979 | 703 | 655 | 1145 |
| Elongation, % | 210 | 150 | 113 | 33 | 97 | 37 | 50 | 97 | 127 | 140 | 93 |
| Hardness, Shore A | 33 | 40 | 52 | 72 | 53 | 62 | 57 | 34 | 23 | 22 | 40 |

All examples had a volume resistivity of at least $10^{13}$ ohm-cm.
Remarks:
Co—Agent-1: See Example 1
Co—Agent-2: Trimethylolpropane trimethacrylate
Co—Agent-3: N,N'—m-phenylenedimaleimide
Co—Agent-4: Triallyl cyanurate
Co—Agent-5: Trimethylolpropane triacrylate
Co—Agent-6: Triethyleneglycol diacrylate
Co—Agent-7: Lauryl acrylate
Co—Agent-8: Triallyl trimellitate
Coagents seemingly enhance the physical properties of invention compositions without loss of electrical properties.

EXAMPLE 4

Several monomeric, unsaturated solvents were employed with compositions of this invention following essentially the procedure described above.

Recipes and results are found in Table IV.

TABLE IV

| | Run No. | | | | |
|---|---|---|---|---|---|
| | 29 | 30 | 31 | 32 | 33 |
| EPDM-1, g | 50 | 50 | 50 | 50 | 50 |
| PIDA, g | 0.1 | 0.1 | 0.1 | 0.1 | 0.1 |
| Peroxide-1, g | 1.5 | 1.5 | 1.5 | 1.5 | 1.5 |
| Vinyltoluene, g | 5 | 15 | — | — | — |
| Styrene, g | — | — | 5 | 15 | — |
| Alphamethyl-styrene, g | — | — | — | — | 10 |
| Co—agent-1, g | — | — | — | — | 5 |
| Properties | | | | | |
| Tensile Strength, g | 73 | 529 | 157 | 517 | 493 |
| Elongation, % | 100 | 300 | 263 | 343 | 150 |
| Hardness, Shore A | 31 | 33 | 26 | 33 | 49 |

All samples exhibited volume resistivity of at least $10^{13}$ ohm-cm.

EXAMPLE 5

Certain fillers and a non-peroxide cure system were evaluated for use in embedding compositions following essentially the procedure of Example 1. For recipes and results see Table V.

TABLE V

| | Run No. | | | |
|---|---|---|---|---|
| | 34 | 35 | 36 | 37 |
| EPDM-1, g | 50 | 50 | 50 | 50 |
| PIDA, g | 0.1 | 0.1 | 0.1 | 0.1 |
| Peroxide-1, g | 1.5 | 1.5 | — | — |
| Co—Agent-1, g | 5.0 | 5.0 | — | — |
| Zinc Oxide, g | — | — | 2.5 | 2.0 |
| GMF[1], g | — | — | 2.0 | 2.0 |
| Stearic Acid, g | — | — | 1.0 | 1.0 |
| Pyrrolidone, g | — | — | 2.5 | — |
| Toluene, g | — | — | 10 | 25 |
| Halane[2], g | — | — | 3.5 | 3.5 |
| Filler[3], g | 10 | — | — | 10 |
| ATH[4], g | — | 75 | — | — |
| Properties | | | | |
| Tensile Strength, | | | | |
| psi | 530 | 345 | 68 | 196 |
| kPa | 3654 | 2379 | 469 | 1351 |
| Elongation, % | 107 | 80 | 863 | 113 |
| Hardness, Shore A | 62 | 79 | 11 | 50 |

All cured compositions had a volume resistivity of at least $10^{13}$ ohm-cm except Run No. 37 ($3.5 \times 10^{10}$).
Remarks:
[1]GMF: Parabenzoquinone dioxime
[2]Halane: 1,3-dichloro-5,5-dimethylhydantoin
[3]Filler: Precipitated hydrated silica
[4]ATH: Aluminum trihydrate

EXAMPLE 6

The composition of Run No. 19 was further evaluated for its electrical properties at room temperature with these results:

| | |
|---|---|
| Volume resistivity, ohm-cm | $10^{13}$ |
| Arc Resistance, sec. | 128 |
| Dielectric strength, V/mil | 420 |
| Dielectric constant at | |
| 100 Hz | 2.55 |
| 1 KHz | 2.44 |
| 1 MHz | 2.42 |
| Dissipation Factor at | |
| 100 Hz | 0.0050 |
| 1 KHz | 0.0064 |
| 1 MHz | 0.0084 |

The data points out the extraordinary suitability of the instant compositions as embedding materials.

For the purpose of embedding, an electrical overload coil having a diameter of about 5 mm, a length of 20 mm and a wire thickness of 1 mm was suspended in a 25 ml beaker by its leads. 10 g of the composition of Run No.

19 was heated to 80° C. and poured into the beaker causing the coil to be fully covered.

The whole assembly was place in a vacuum oven in order to remove any entrapped air for 10 minutes, and subsequently was exposed to 180° C. for 30 minutes in an oven.

The coil embedded by the cured elastomer was resistant to shock, moisture, mechanical abuse such as pressure and scratching without losing its original electrical characteristics.

Similar results as above are obtained using terpolymers of ethylene-propylene-1,4 hexadiene and ethylene-propylene-5-ethylidene-2-norbornene.

What is claimed is:

1. An embedded structure comprising
   (a) circuitry; and
   (b) a pourable embedding composition comprising:
   (i) an ethylene-alpha-olefin copolymer having a molecular weight of from about 500 to about 20,000; wherein said copolymer weight ratio may range from 85/15 to 35/65; and
   (ii) a curative in the range of from about 2–20 parts per hundred parts of copolymer.

2. The embedded structure of claim 1 wherein said copolymer is ethylene-propylene copolymer or ethylene-propylene-non-conjugated diene terpolymer; wherein the amount of non-conjugated diene present is between 5 and 35%.

3. The embedded structure of claim 2 wherein said curative is an organic peroxide or hydroperoxide.

4. The embedded structure of claim 1 wherein said composition comprises, in addition, a coagent for said curative.

* * * * *